US012532416B2

United States Patent
Perrin et al.

(10) Patent No.: US 12,532,416 B2
(45) Date of Patent: Jan. 20, 2026

(54) THERMALLY IMPROVED PCB FOR SEMICONDUCTOR POWER DIE CONNECTED BY VIA TECHNIQUE AND ASSEMBLY USING SUCH PCB

(71) Applicant: MITSUBISHI ELECTRIC CORPORATION, Tokyo (JP)

(72) Inventors: Remi Perrin, Rennes (FR); Julio Brandelero, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 178 days.

(21) Appl. No.: 18/562,190

(22) PCT Filed: Oct. 14, 2021

(86) PCT No.: PCT/JP2021/038848
§ 371 (c)(1),
(2) Date: Nov. 17, 2023

(87) PCT Pub. No.: WO2022/249510
PCT Pub. Date: Dec. 1, 2022

(65) Prior Publication Data
US 2024/0237208 A1    Jul. 11, 2024

(30) Foreign Application Priority Data

May 25, 2021 (EP) ..................................... 21305679

(51) Int. Cl.
*H05K 1/11*  (2006.01)
*H05K 3/00*  (2006.01)

(52) U.S. Cl.
CPC ............. *H05K 1/113* (2013.01); *H05K 1/115* (2013.01); *H05K 3/0047* (2013.01);
(Continued)

(58) Field of Classification Search
CPC ...... H05K 1/0206; H05K 1/185; H05K 1/113; H05K 1/115; H05K 2201/0215;
(Continued)

(56) References Cited

U.S. PATENT DOCUMENTS

2011/0156228 A1    6/2011  Kobayashi et al.
2014/0131847 A1*   5/2014  Yee ....................... H05K 1/0209
                                                    257/E23.051
(Continued)

FOREIGN PATENT DOCUMENTS

JP      2018-119347 A      6/2016
WO    WO 2005/024946 A1    3/2005
WO    WO 2017/094589 A1    6/2017

OTHER PUBLICATIONS

International Search Report (PCT/ISA/210) issued in PCT/JP2021/038848, dated Feb. 16, 2022.
(Continued)

*Primary Examiner* — Roshn K Varghese
(74) *Attorney, Agent, or Firm* — Birch, Stewart, Kolasch & Birch, LLP

(57) ABSTRACT

Power module comprising a power semiconductor die and at least one substrate comprising an insulating layer in contact with a metallized connection surface of said die and at least one conductive path on a conductive layer on a face of the insulating layer opposite to the metallized connection surface of the die and wherein said insulating layer comprises vias filled with conductive material to provide connecting pads between said metallized connection surface of said die and said conductive path, and wherein said vias are arranged with a decreasing density from at least one hot spot position of said metallized connection surface when the die is in operation to a peripheral area of said metallized connection surface.

13 Claims, 5 Drawing Sheets

(52) U.S. Cl.
CPC ............... *H05K 2201/0215* (2013.01); *H05K 2201/09409* (2013.01); *H05K 2201/09609* (2013.01); *H05K 2201/10689* (2013.01); *H05K 2203/0228* (2013.01); *H05K 2203/06* (2013.01); *H05K 2203/107* (2013.01)

(58) Field of Classification Search
CPC .......... H05K 2201/09409; H05K 2201/09609; H05K 2201/10689; H05K 3/0047; H05K 2203/0228; H05K 2203/06; H05K 2203/107; H01L 23/49833; H01L 23/5385; H01L 23/3677
See application file for complete search history.

(56) References Cited

U.S. PATENT DOCUMENTS

| | | | | |
|---|---|---|---|---|
| 2018/0331012 A1* | 11/2018 | Shimakawa | ......... | H05K 1/0206 |
| 2019/0373732 A1* | 12/2019 | Taniguchi | ............ | H05K 1/0206 |
| 2020/0296839 A1* | 9/2020 | Kondo | ................ | H05K 1/0206 |
| 2021/0043613 A1 | 2/2021 | Morand et al. | | |
| 2021/0327775 A1* | 10/2021 | Koya | ................... | H05K 1/0206 |

OTHER PUBLICATIONS

Written Opinion of the International Searching Authority (PCT/ISA/237) issued in PCT/JP2021/038848, dated Feb. 16, 2022.
Japanese Office Action for Japanese Application No. 2023-574885, dated Aug. 27, 2024, with English translation.
Indian Office Action for Indian Application No. 202347077474, dated Mar. 25, 2025, with an English translation.

* cited by examiner

THERMALLY IMPROVED PCB FOR SEMICONDUCTOR POWER DIE CONNECTED BY VIA TECHNIQUE AND ASSEMBLY USING SUCH PCB

TECHNICAL FIELD

The present disclosure concerns improvements in reliability and lifetime of connections between power semiconductor dies and PCBs and in particular semiconductor dies embedded in PCBs and connected through vias to a conductive layer of such PCBs.

BACKGROUND ART

One major concern of power electronic nowadays is the reliability of power modules due to their important place in power converting systems and their high cost. On a classical power semiconductor module where a power semiconductor is connected to a PCB, soldering join and wire-bonding degradation is therefore largely argued in the literature. Technologies where semiconductor dies are connected with vias inside a PCB substrate enables to increase the reliability and the efficiency of a power semiconductor die. However, the specific environment does not avoid failures due to CTE (coefficient of thermal expansion) mismatch between the different materials, e.g. Copper, FR4 and Si, SiC or GaN. In such a case, mechanical stress due to unmatched thermal expansion characteristics will lead to fatigue damage and consequently delamination of the PCB and breakdown of the assembly.

As an example, in the prior art realization of dies embedded in PCBs or connected to PCBs with a uniform via pattern, the temperature being not constant on the power semiconductor die surface where the die is connected with the vias, a premature deterioration of the hotter regions where such power semiconductor die is connected to the PCB may occur. In addition, as the deterioration increases the temperature on the concerned zone which will increase further will accelerate even more the deterioration which reduces drastically the reliability of the PCB embedded semiconductor die.

In order to reduce fatigue near the die, some solutions exist such as using specific soldering interface techniques.

As an example, by arranging ball bonding in a specific pattern such as disclosed in document U.S. Pat. No. 8,008,786B2, the tension applied on the die is working in the opposite way than the mechanical stress from thermal variation. Therefore, fatigue is reduced on the die and reliability is improved.

Another technique as disclosed in document U.S. Pat. No. 6,897,568B2 concerns a solution with some pads made out of flexible material providing a flexible layer. On top of these pads the metal contact is made with an extra layer on it. The flexible layer is providing a soft layer that support the component soldered on top regarding mechanical variation. However, the interconnection in between the flexible layer and the substrate is a clear CTE mismatch that is a clear weakness of that solution.

In document EP 3 745 828 A1 in name of the applicant, a technique to provide high density vias using a classical PCB manufacturing technique such as laser vias drilling and electrodeposition is disclosed. This helps having low thermal connection in between a die and top and bottom copper layers. Moreover, this document provides a PCB manufacturing process capable of variable via placement on a dedicated area.

SUMMARY OF INVENTION

In order to solve the issue of premature deterioration of the connections with the hotter regions of power semiconductor dies, the present disclosure proposes connection patterns which are based on temperature distribution on an actual power semiconductor die in order to equilibrate mechanical stress on such die. This provides better performances and a longer lifetime thanks to a more uniform distribution of the temperature.

More precisely, the present disclosure concerns a power module comprising a power semiconductor die and at least one substrate comprising an insulating layer in contact with a metallized connection surface of said die and at least one conductive path on a conductive layer on a face of the insulating layer opposite to the metallized connection surface of the die and wherein said insulating layer comprises vias filled with conductive material to provide connecting pads between said metallized connection surface of said die and said conductive path, in which said vias are arranged with a decreasing density from a hot spot position of said metallized connection surface when the die is in operation to a peripheral area of said metallized connection surface.

This reduces the thermal stress on the joining layer in operation in particular when temperature cycling occurs.

Preferably, a density of vias, located on reduced temperature areas within said semiconductor die in operation, is reduced.

This increases $R_{TH}$ where low temperature occurs.

In a second embodiment, said vias are arranged as a peripheral area around at least one cavity of a length and width greater than the diameter of the vias in said insulating layer, said vias and said cavity being filled with conductive material to form respectively connecting pads and a connecting block joining said metallized connection surface and said conductive path, said connecting pads and said connecting block providing a mechanical, electrical and thermal joining layer of said die and said conductive path of said conductive layer in said module.

This permits to have an area with a low thermal resistance and a solid joint between the die and the conductive path of the substrate Said cavity which is a through hole in the insulating layer may preferably have a length and width greater or equal to the length and width of four vias.

In such embodiment, the temperature of the connection above a large hotspot may be reduced and this provides a strong joint between a conductive path on a substrate and a metallized connection surface of a die and a more homogeneous thermal distribution in the joint.

A distribution of said vias and size of said cavity may be defined to decrease the thermal resistance $R_{TH}$ of the connecting layer in higher die temperature areas of said metallized connection surface and increase the thermal resistance of the joining layer in lower temperature areas of said connection surface thus increasing homogeneity of the temperature of said joining layer and connection surface during operation of the power module.

The insulating layer may be a PCB insulating layer having at least one cut cavity filled with conductive material to provide said connecting block.

The PCB may be an epoxy resin plus fiberglass PCB.

Said conductive material may be electrodeposited copper.

This permits to use traditional PCB manufacturing techniques.

The present disclosures proposes also a power module comprising a first substrate according to the present disclosure with an upper conductive path connected to an upper side metallized connection surface of the power semiconductor die and a second substrate according to the present disclosure with a lower conductive path connected to a lower side metallized connection surface of the power semiconductor die where a spacer layer is provided around lateral sides of said power semiconductor die between the insulating layers of the first substrate and the second substrate.

The die may comprise a command contact connected with one or more vias to a side of the module.

This allows to use the invention with transistors or other three terminals components.

The present disclosure concerns further a substrate for manufacturing a power module having a connection area to which a semiconductor die metallized connection surface is to be connected mechanically, electrically and thermally, which comprises a PCB insulating layer and where said connection area comprises vias having a decreasing density in direction of an outer border of said connection area with at least one cavity surrounded by said vias and where said substrate comprises a PCB conducting layer with at least one conductive path comprising said connection area.

Said cavity and vias are preferably designed to be filled with conductive material to provide a connection between said connecting block and said connecting pads with said connection area of said at least one conductive path.

Preferably, the vias have a decreasing density from the center of the connection area to an outer border of the connection area.

The present disclosure concerns further a manufacturing method of a power module of the present disclosure which comprises a step of providing at least one conductive path on a side of an insulating layer of the substrate opposite to said metallized connection surface of said die, a step of drilling holes in said insulating layer to form said vias with a decreasing density from a center of said metallized connection surface to a peripheral area of said metallized connection surface, a step of filling said vias with conductive material thus providing connecting pads providing an electrical connection between said metallized connection surface and said conductive path.

The method may comprise a step of cutting said at least one insulating layer to form at least one cavity surrounded by said vias, a step of filling said cavity with conductive material to form a connecting block providing with said connecting pads the electrical connection between said metallized connection surface and said conductive path.

The die may be embedded in a PCB, the method comprising steps of:
providing a first laminated layer with a spacer layer to form a bottom layer having a housing;
applying a power semiconductor die in said housing;
applying a prepreg insulating layer of fiberglass woven fabric impregnated with epoxy resin on said spacer layer and the die;
pressing and curing the prepreg layer to provide a top layer, the top layer and bottom layer forming a laminate in which the die is embedded;
drilling vias or drilling vias and a cut area in the bottom insulating layer up to a first metallized surface of the die; and in the upper insulating layer up to a second metallized surface of the die,
filling said vias or vias and cut areas in said upper insulating layer and said lower insulating layer with conductive material to provide a bottom joining layer in electrical contact with said first metallized surface and a bottom conductive path on the outer surface of said bottom insulating layer and an upper joining layer in electrical contact with said second metallized surface and an upper conductive path on the outer surface of said upper insulating layer.

This provides a die embedded in a multilayer PCB and strong joint between an upper metallized surface of the die with an upper conductive path and a strong joint between a lower metallized surface of the die with a lower conductive path with homogeneous thermal characteristics of the two joints.

The vias have a decreasing density from the center to the periphery of the joining layer.

Said steps of drilling and said step of cutting of said insulating layers to form said vias and said cavity may be done with a $CO_2$ laser.

In addition or independently, said steps of filling said vias and said cavity with conductive material and providing said conductive paths may be done through electrodeposition processes.

The method may also comprise a step of removing part of the conductive layer above a position of said via and cavity locations using an UV laser prior to said step of drilling and cutting said insulating layer.

A detailed description of exemplary embodiments of the invention will be discussed hereunder in reference to the attached drawings.

DESCRIPTION OF EMBODIMENTS

Figure 1A:
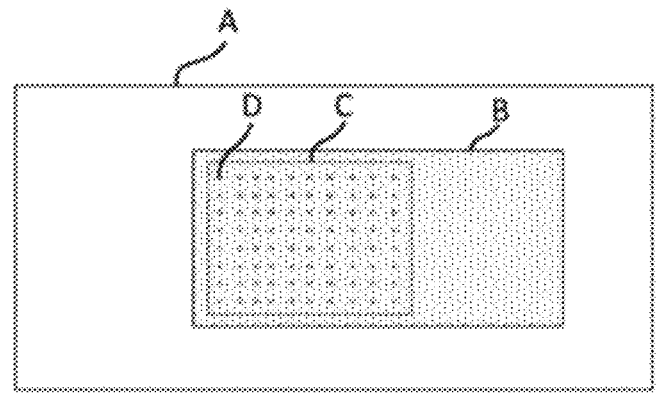
FIG. 1A is a view from above of a prior art design.
Figure 1B:
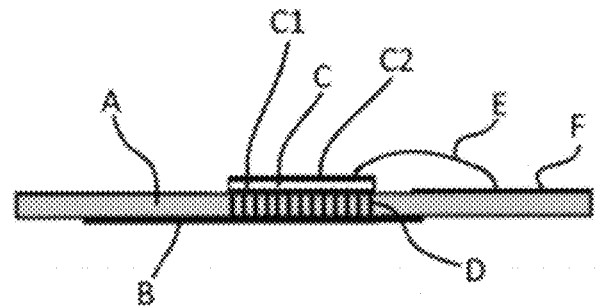
FIG. 1B is a lateral cut view of a prior art design.

The present disclosure concerns power modules where a power semiconductor die is located on or embedded in a substrate such as a PCB (printed circuit board) and preferably a multilayer PCB. FIGS. 1A and 1B show prior art designs of modules where such a die is connected on a first side of a PCB with traditional bonding method E and connected to the other side of the PCB with connecting pads D made with vias drilled in the insulating substrate A and filled with conductive material such as electrodeposited copper.

Such pads D connect a metallized surface C1 of the power semiconductor die C with a PCB conductive path B on an opposite side of the die with respect to an insulating layer A of the PCB. The connection is done with the connecting pads D which are regularly spaced. In FIG. 1A where the substrate is viewed from above and has a die C shown in dotted lines under the insulating layer A, it can be seen that the connecting pads made with the filled vias are regularly spaced above or under the metallized surface of the die and in FIG. 1B which is a lateral cut view at the level of a connecting pads row it can be seen that the vias filled with conductive material extend from the die C metallized surface C1 to the conductive path B.

This traditional design provides a good connection between the metallized surface of the die and the conductive path but is subject to thermal stress upon current cycling in the power semiconductor which can cause breaks in the pads which may result in a failure of the module after some time of working.

In such a uniform via pattern, as the temperature is not constant on the power semiconductor die, a premature deterioration of the hotter regions of the power semiconductor die occurs. The deterioration increases the temperature on the concerned zone which will accelerate even more the deterioration which reduces drastically the reliability of the PCB embedded die. Such a design does no address one major concern of power electronic nowadays which is the reliability of power module due to their important place in power converting systems and their high cost. Such PCB embedding die technology where a die is only connected with vias inside the PCB substrate enables to increase the reliability and the efficiency of a power semiconductor die. However, the specific environment does not avoid temperature expansion coefficients mismatch in between the different material, e.g. Copper, FR4 and Si, SiC or GaN, therefore mechanical stress will lead to fatigue damage and consequently delamination of the PCB and breakdown of the assembly.

Figure 2A:
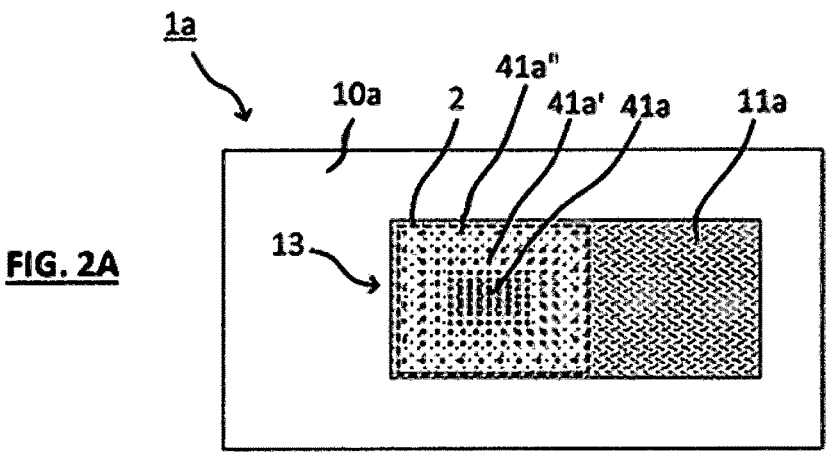
FIG. 2A is a view from above of a first embodiment.
Figure 2B:
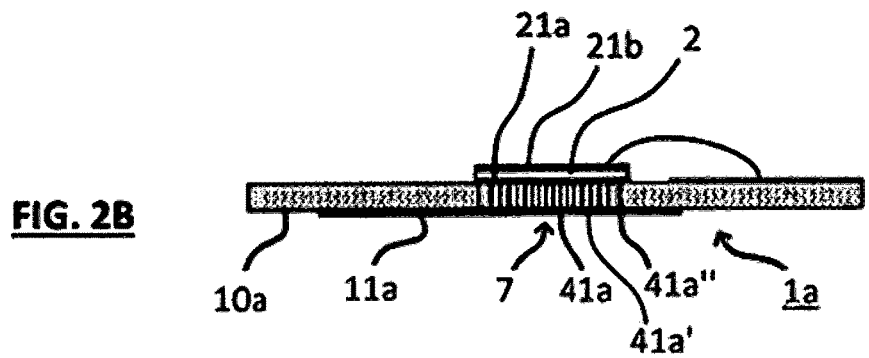
FIG. 2B is a lateral cut view of a first embodiment.

In a first embodiment of the present disclosure as per FIGS. 2A and 2B where the power module is similar to the power module of FIGS. 1A and 1B, the power semiconductor die 2 is also connected to a conductive path 11a of a substrate 1a, located on an opposite side of an insulating layer 10a with respect to the die 2.

The substrate has a connection area 13 to a conductive path 11a on a conducting layer of the substrate. A semiconductor die metallized connection surface 21a, as seen in FIG. 2B, is to be connected mechanically, electrically and thermally, to such conductive path 11a and in the present design, the connection area of the insulating layer 10a comprises pads made of vias filled with a conductive material and organized to provide a high density of pads such as pads 41a in a center part of the metallized surface to be connected, a first reduced density around such center part with pads 41a' and a further reduced density in the vicinity of the peripheral area of the metallized surface to be connected with pads 41a".

According to this design, the vias are arranged with a decreasing density from a hot spot position of said metallized connection surface when the die is in operation to a peripheral area of said metallized connection surface. Usually, the hot spot of the die in operation is in the center of the die but such hot spot may be off centered and, in such case the high density via pattern will also be off centered.

Figure 2C:
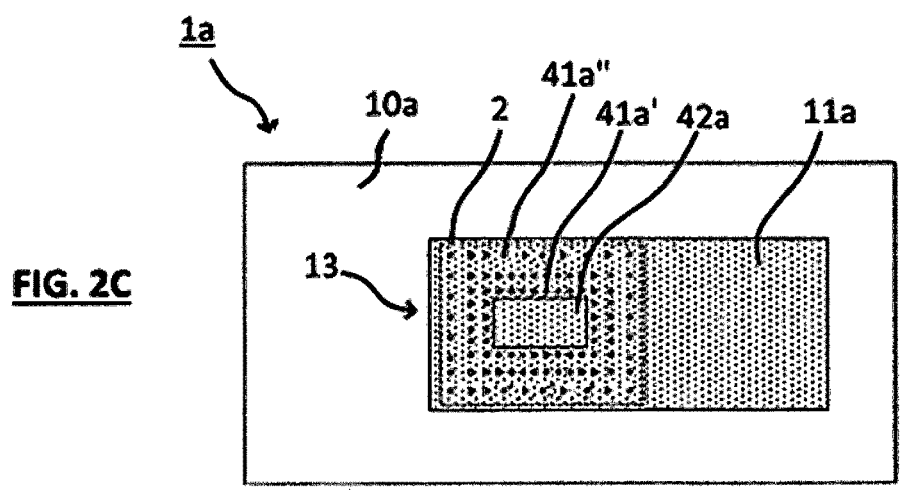
FIG. 2C is a view from above of a second embodiment.
Figure 2D:
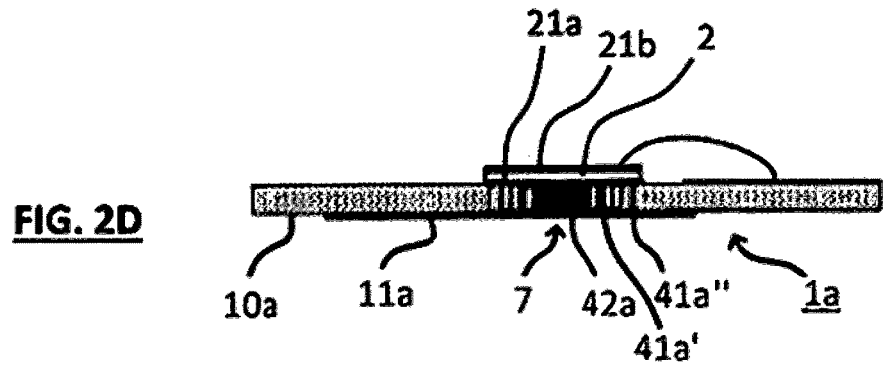
FIG. 2D is a lateral cut view of a second embodiment.

In a second embodiment as per FIGS. 2C and 2D, a cavity, preferably of a length and width greater or equal to the length and width of four vias, is made above the hot spot of the die and the cavity and the vias are filled with conductive material 7 to provide respectively a connecting block 42a and connecting pads 41a' and 41a" of decreasing density to make the connection between the metallized connection surface of the power semiconductor die and the conductive path 11a.

Dimensions of dies used for power semiconductors is usually between 2 mm×2 mm to 8 mm×8 mm and the hot spot area has usually a diameter of about 0.5 mm to 1 mm depending of the size of the component. In order to cover the hot spot and reduce temperature and to give an idea, the cavity filled with conductive material may then respectively have a length and width of more than 0.5 mm depending on the size of the hot spot while the vias have a diameter of about 40 µm to 0.5 mm. The cavity may be square, rectangular or circular depending on the hot spot configuration.

According to this second embodiment, the connecting pads 41a and connecting block 42a joining said metallized connection surface 21a and said conductive path 11a provide the mechanical, electrical and thermal joining layer of said die and said conductive path of said conductive layer in said module.

In this design, the connecting block is in correspondence with the hotter region of the die and provides a lower thermal resistance than the connecting pads thus providing a more homogeneous temperature in the connection area of the die to the conductive path which increases the life time of the module through a reduced thermal stress of the connection during thermal cycling of the power module in operation. Thus, the thermal-mechanical stress is well redistributed on the assembly, the fatigue mechanisms, caused by the temperature swings, are reduced and the lifetime of the PCB embedded die is improved.

To enhance the temperature homogeneity, a distribution of said vias 3a and size of the cavity 5a are defined to decrease the thermal resistance RTH of the connecting layer in higher die temperature areas (e.g. in a central hot area of the die) of said metallized connection surface and increase the thermal resistance of the joining layer in lower temperature areas (e.g. in the periphery of the die) of said connection surface thus increasing homogeneity of the temperature of said joining layer and connection surface during operation of the power module. In particular in the distribution as shown, said vias 3a are provided with a decreasing density from the cavity 5a to an outer border of the peripheral area to follow the decrease in temperature from the center to the periphery on the surface of the die. In addition, if the die comprises low temperature spots, a density of vias 5a, located on reduced temperature areas within said semiconductor die in operation may be reduced.

The insulating layer 10a may be a PCB insulating layer were the cavity 5a is provided and filled with conductive material 7 to provide said connecting block 42a and the conductive material may be electrodeposited copper.

Figure 3:
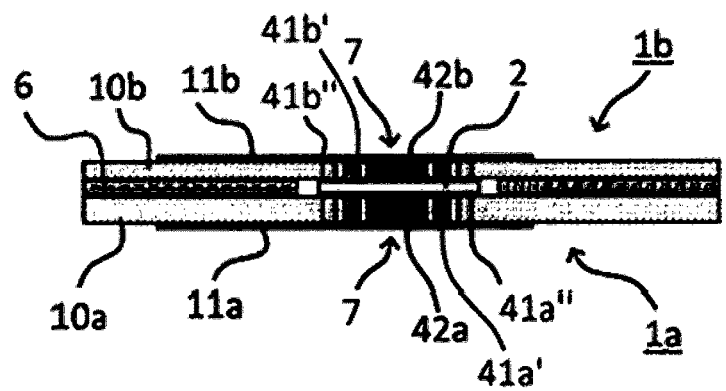
FIG. 3 is a lateral cut view of a power module comprising a die embedded in a PCB made in accordance with the second embodiment.

As shown in FIG. 3, the power module may embed the power semiconductor die 2 between two PCB substrates, the module comprising an upper substrate 10b with an upper conductive path 11b connected to an upper side metallized connection surface 21b of the power semiconductor die 2 and a lower substrate 10a with a lower conductive path 11a connected to a lower side metallized connection surface 21a of the power semiconductor die 2. In such case a spacer layer 6 is provided around lateral sides of said power semiconductor die between the insulating layers of the first substrate and the second substrate to keep the upper substrate and lower substrates parallel.

The connection patterns of both the upper side of the die and lower side of the die are similar and an upper connecting block 42b surrounded by upper connecting pads 41b', 41b" of decreasing density connect the upper metallized surface 21b (seen in FIG. 4A) of the die with an upper conductive path 11b and a lower connecting block 42a surrounded by lower connecting pads 41a', 41a" of decreasing density connect the lower metallized surface 21a of the die with a lower conductive path 11a.

Figure 4A:
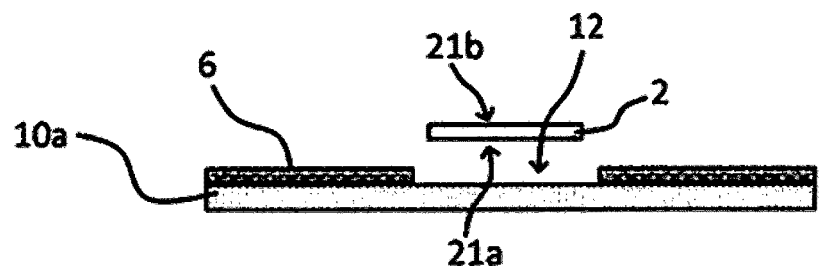
FIG. 4A is an exemplary manufacturing step of the module of FIG. 3.
Figure 4B:
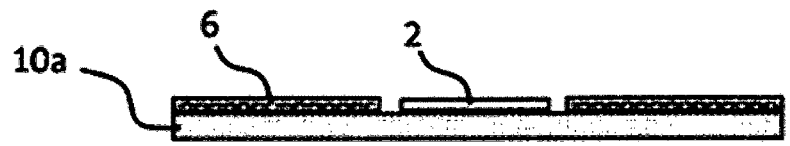
FIG. 4B is an exemplary manufacturing step of the module of FIG. 3.
Figure 4C:
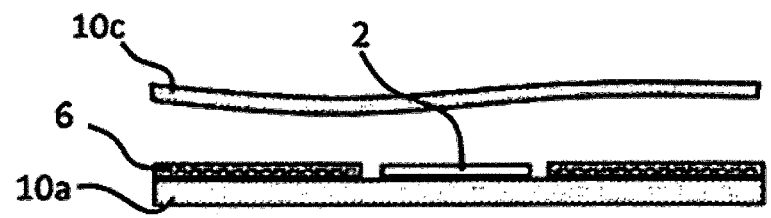
FIG. 4C is an exemplary manufacturing step of the module of FIG. 3.
Figure 4D:
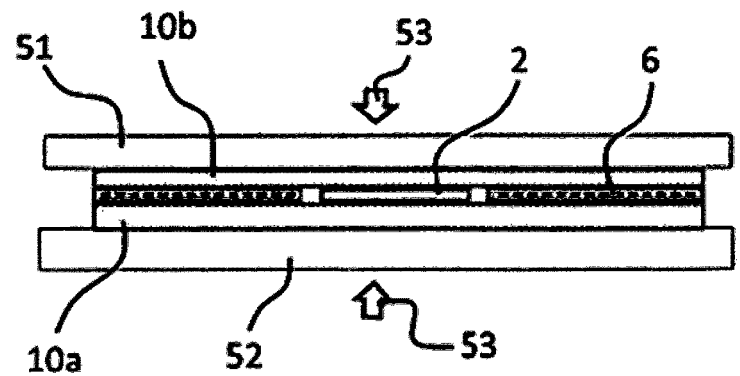
FIG. 4D is an exemplary manufacturing step of the module of FIG. 3.
Figure 4E:
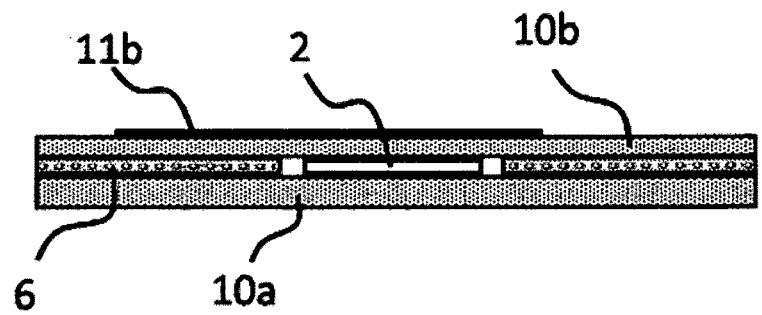
FIG. 4E is an exemplary manufacturing step of the module of FIG. 3.
Figure 4F:
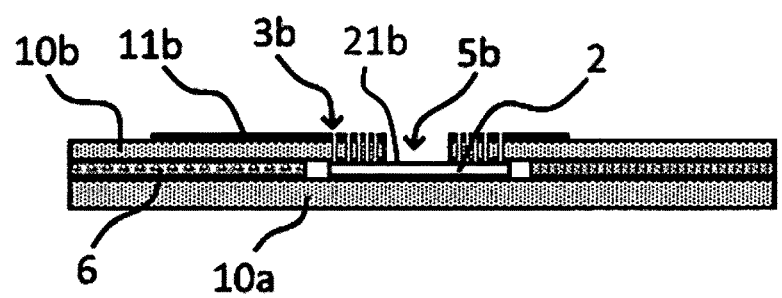
FIG. 4F is an exemplary manufacturing step of the module of FIG. 3.
Figure 4G:
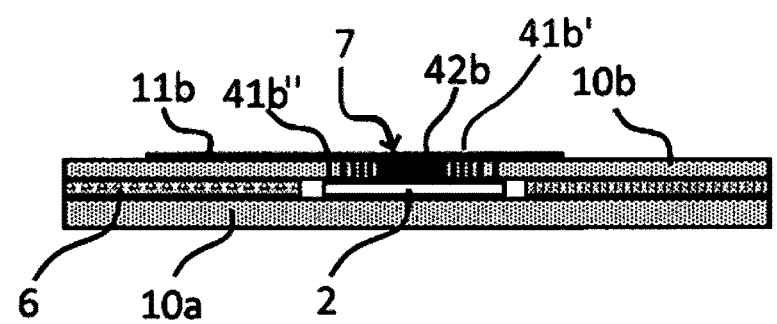
FIG. 4G is an exemplary manufacturing step of the module of FIG. 3.

The present disclosure also concerns a manufacturing method of a power module where a die is embedded in a PCB as disclosed in FIGS. 4A to 4I, 3 for the second embodiment and FIGS. 4A to 4E and 5A, 5B for the first embodiment. FIGS. 4A to 4E concern embedding a die in a three-layer PCB, FIG. 4E concerns a step of providing at least one conductive path 11a, 11b on a side of an insulating layer of the substrate 1a, 1b opposite to said metallized connection surface 21a, 21b of said die 2, in FIG. 4F a step of drilling holes in said insulating layer to form said vias 3a, 3b and a step of cutting a hole in said at least one insulating layer to form a cavity 5a, 5b. In FIG. 4G a step of filling said vias and said cavity with conductive material 7 thus providing a connecting block 42a, 42b and connecting pads 41a', 41a", 41b', 41b" providing an electrical connection between said metallized connection surface and said conductive path.

The cavity corresponds to a die hot spot having a position that may be previously determined according to the power semiconductor internal layout or previously measured.

Figure 4H:
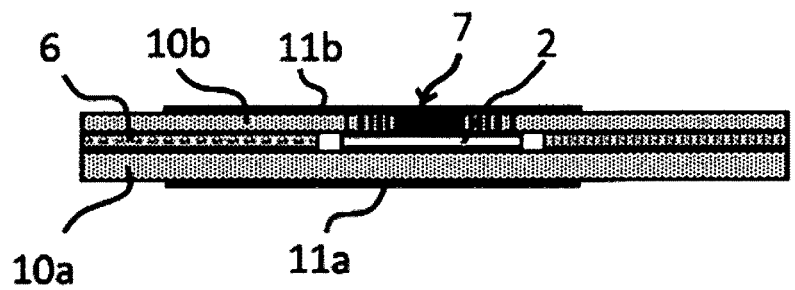
FIG. 4H is an exemplary manufacturing step of the module of FIG. 3.

FIG. 4H describes a first step of realization of the lower layer where a conductive path 11a is deposited.

Figure 4I:
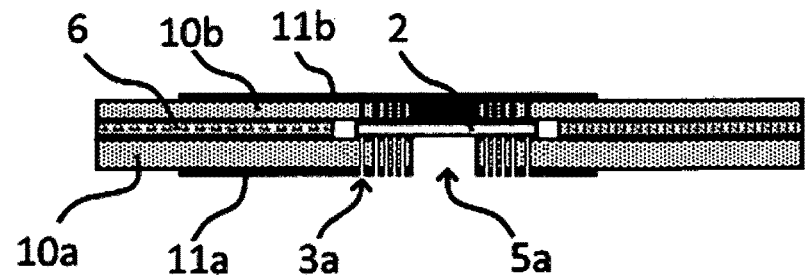
FIG. 4I is an exemplary manufacturing step of the module of FIG. 3.
Figure 5A:
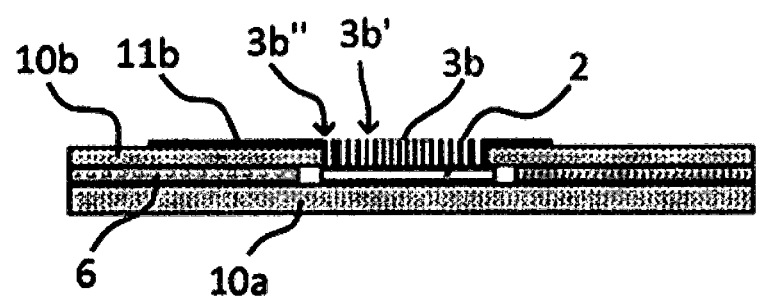
FIG. 5A is a cut side view of steps of manufacturing a module of the first embodiment.
Figure 5B:
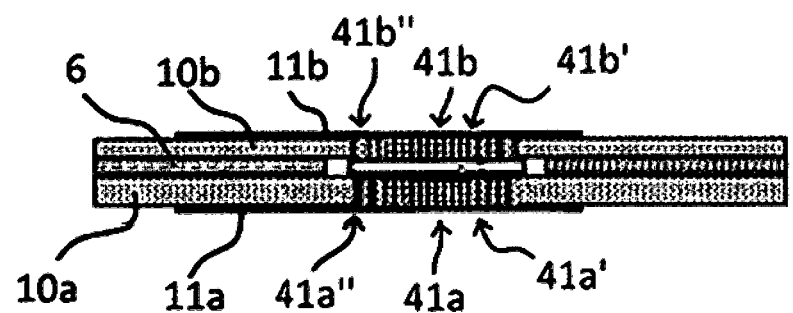
FIG. 5B is a cut side view of steps of manufacturing a module of the first embodiment.

FIG. 5A which is a step following the step of FIG. 4E according to the first embodiment concerns drilling via holes 3b, 3b', 3b" with a decreasing density from the center to the border of the metallized connection surface area on a first side in a similar step to FIG. 4F for the second embodiment. FIG. 5B shows the finished two side connections with variable density vias. Drawings of the steps equivalent to the steps of FIGS. 4G to 4I are omitted for such embodiment as the process is similar, the cavity being replaced by high density vias.

The variable density vias comprise on both sides of the module high density vias 3a, 3b in the center, medium density vias 3a', 3b' in an intermediate position and then low density vias 3a", 3b" near the border of the connection area.

A method for a dual side connection in correspondence with the second embodiment in case of an embedded power semiconductor die in a multilayer substrate or PCB may comprise:
  providing a first laminated layer 10a with a spacer layer 6 to form a bottom layer having a housing 12 as in FIG. 4A, applying a power semiconductor die 2 in said cavity-housing as in FIG. 4B,
  applying a prepreg insulating layer 10c of fiberglass woven fabric impregnated with epoxy resin on said spacer layer and the die as in FIG. 4C;
  pressing and curing 51, 52, 53 the prepreg layer to provide a top layer 10b, the top layer and bottom layer 10a forming a laminate in which the die is embedded as in FIG. 4D;
  providing a conductive path 11b on the insulating layer 10b as in FIG. 4E;
  drilling vias 3b and a cut area 5b in the upper insulating layer 10b up to a first metallized surface 21b of the die as in FIG. 4F;
  filling said vias 3b and cut areas 5b in said upper insulating layer 10b with conductive material 7 to provide an upper joining layer with pads 41b' and connecting block 42b in electrical contact with said first metallized surface then providing a bottom conductive path on the outer surface of said bottom insulating layer.

The lower joining layer is then made in a similar fashion with providing the connecting path 11a in FIG. 4H, drilling the vias 3a and cavity 5a in FIG. 4I, filling said vias and said cavity with conductive material 7 in said vias and cavity in FIG. 3 to provide the lower joining layer and the finished module.

These steps of providing the conductive path, drilling and filling the vias and cavity may be done in sequence as shown in FIG. 4F to 4I or 5A, 5B but may also be done simultaneously on both sides of the laminate depending of the available processing means such as metallization means and drilling and cutting means.

The steps of drilling holes in the insulating layers and cutting of said insulating layers to form said cut areas are preferably done with a $CO_2$ laser which pierce the insulating layer of the substrate but does not pierce the metallized surface of the die.

In case the conductive path is present on the insulating surface of the substrate, a step of removing part of the conductive layer above a position of said holes and cut area locations using an UV laser prior to said step of drilling holes and cutting said insulating layer. Filling said vias and cut areas with conductive material and providing said conductive paths are done through electrodeposition processes or other processes known in the field of PCB realization.

In addition, for a three terminal component such as a transistor or other, a connection to the signal terminal may be provided as known in the art.

The invention which is in accordance with the following claims is not limited to the above description and in particular, as said above, the conductive path or paths may be provided before or after drilling the vias and cutting the cavity. In addition, the PCB may be provided with further layers and more than one cavity may be considered in case of a die with more than one hot spot.

The invention claimed is:
1. Power module comprising:
a power semiconductor die; and
at least one substrate comprising an insulating layer in contact with a metallized connection surface of said die and at least one conductive path on a conductive layer on a face of the insulating layer opposite to the metallized connection surface of the die, wherein said insulating layer comprises vias filled with conductive material to provide connecting pads between said metallized connection surface of said die and said conductive path, and
said vias are arranged with a decreasing density from at least one hot spot position of said metallized connection surface when the die is in operation to a peripheral area of said metallized connection surface, said vias providing a mechanical, electrical, and thermal joining layer between said die and said conductive path of said conductive layer in said module,
wherein said vias are arranged as a peripheral area around at least one cavity of a length and width greater than the diameter of the vias in said insulating layer, said vias and said cavity being filled with conductive material to form respectively connecting pads and a connecting block joining said metallized connection surface and said conductive path, said connecting pads and said connecting block providing a mechanical, electrical and thermal joining layer of said die and said conductive path of said conductive layer in said module, and wherein the insulating layer is a PCB insulating layer having at least one cut cavity filled with conductive material to provide said connecting block.

2. The power module according to claim 1, wherein a density of vias, located on reduced temperature areas within said semiconductor die in operation, is reduced.

3. The power module according to claim 1, wherein said conductive material is electrodeposited copper.

4. The power module according to claim 1 comprising a first substrate with an upper conductive path connected to an upper side metallized connection surface of the power semiconductor die and a second substrate with a lower conductive path connected to a lower side metallized connection surface of the power semiconductor die and wherein a spacer layer is provided around lateral sides of said power semiconductor die between an insulating layer of the first substrate and an insulating layer of the second substrate.

5. Substrate for manufacturing the power module according to claim 1 having a connection area to which a semiconductor die metallized connection surface is to be connected mechanically, electrically and thermally, characterized in that said substrate comprises a PCB insulating layer and wherein said connection area comprises vias having a decreasing density in direction of an outer border of said connection area and at least one cavity surrounded by said vias and wherein said substrate comprises a PCB conducting layer with at least one conductive path comprising said connection area.

6. The substrate according to claim 5 wherein the vias have a decreasing density from a center of the connection area to an outer border of the connection area.

7. Power module comprising:
a power semiconductor die; and
at least one substrate comprising an insulating layer in contact with a metallized connection surface of said die and at least one conductive path on a conductive layer on a face of the insulating layer opposite to the metallized connection surface of the die, wherein
said insulating layer comprises vias filled with conductive material to provide connecting pads between said metallized connection surface of said die and said conductive path, and
said vias are arranged with a decreasing density from at least one hot spot position of said metallized connection surface when the die is in operation to a peripheral area of said metallized connection surface, said vias providing a mechanical, electrical, and thermal joining layer between said die and said conductive path of said conductive layer in said module,
wherein said vias are arranged as a peripheral area around at least one cavity of a length and width greater than the diameter of the vias in said insulating layer, said vias and said cavity being filled with conductive material to form respectively connecting pads and a connecting block joining said metallized connection surface and said conductive path, said connecting pads and said connecting block providing a mechanical, electrical and thermal joining layer of said die and said conductive path of said conductive layer in said module, and a distribution of said vias and size of said cavity are defined to decrease the thermal resistance $R_{TH}$ of the connecting layer in higher die temperature areas of said metallized connection surface and increase the thermal resistance of the joining layer in lower temperature areas of said connection surface thus increasing homogeneity of the temperature of said joining layer and connection surface during operation of the power module.

8. A manufacturing method of a power module including a power semiconductor die, and at least one substrate comprising an insulating layer in contact with a metallized connection surface of said die and at least one conductive path on a conductive layer on a face of the insulating layer opposite to the metallized connection surface of the die, wherein said insulating layer comprises vias filled with conductive material to provide connecting pads between said metallized connection surface of said die and said conductive path, and said vias are arranged with a decreasing density from at least one hot spot position of said metallized connection surface when the die is in operation to a peripheral area of said metallized connection surface, said vias providing a mechanical, electrical, and thermal joining layer between said die and said conductive path of said conductive layer in said module,
wherein said vias are arranged as a peripheral area around at least one cavity of a length and width greater than the diameter of the vias in said insulating layer, said vias and said cavity being filled with conductive material to form respectively connecting pads and a connecting block joining said metallized connection surface and said conductive path, said connecting pads and said connecting block providing a mechanical, electrical and thermal joining layer of said die and said conductive path of said conductive layer in said module, and
wherein the insulating layer is a PCB insulating layer having at least one cut cavity filled with conductive material to provide said connecting block or wherein a distribution of said vias and size of said cavity are defined to decrease the thermal resistance $R_{TH}$ of the connecting layer in higher die temperature areas of said metallized connection surface and increase the thermal resistance of the joining layer in lower temperature areas of said connection surface thus increasing homogeneity of the temperature of said joining layer and connection surface during operation of the power module, the method comprising:
providing at least one conductive path on a side of an insulating layer of the substrate opposite to said metallized connection surface of said die;
drilling holes in said insulating layer to form said vias with a decreasing density from a center of said metallized connection surface to a peripheral area of said metallized connection surface; and
filling said vias with conductive material thus providing connecting pads providing an electrical connection between said metallized connection surface and said conductive path.

9. The manufacturing method of a power module according to claim 8 comprising cutting said at least one insulating layer to form at least one cavity surrounded by said vias, filling said cavity with conductive material to form a connecting block providing with said connecting pads the electrical connection between said metallized connection surface and said conductive path.

10. The manufacturing method of a power module according to claim 9 where the die is embedded in a PCB comprising:
- providing a first laminated layer with a spacer layer to form a bottom layer having a housing;
- applying a power semiconductor die in said housing;
- applying a prepreg insulating layer of fiberglass woven fabric impregnated with epoxy resin on said spacer layer and the die;
- pressing and curing the prepreg layer to provide a top layer, the top layer and bottom layer forming a laminate in which the die is embedded;
- drilling vias and at least one cut area in the bottom insulating layer up to a first metallized surface of the die; and drilling vias and at least one cut area in the upper insulating layer up to a second metallized surface of the die,
- filling said vias and said cut areas in said upper insulating layer and said lower insulating layer with conductive material to provide a bottom joining layer in electrical contact with said first metallized surface and a bottom conductive path on the outer surface of said bottom insulating layer and an upper joining layer in electrical contact with said second metallized surface and an upper conductive path on the outer surface of said upper insulating layer.

11. The manufacturing method of a power module according to claim 8 where the die is embedded in a PCB comprising:
- providing a first laminated layer with a spacer layer to form a bottom layer having a housing;
- applying a power semiconductor die in said housing;
- applying a prepreg insulating layer of fiberglass woven fabric impregnated with epoxy resin on said spacer layer and the die;
- pressing and curing the prepreg layer to provide a top layer, the top layer and bottom layer forming a laminate in which the die is embedded;
- drilling said vias with a decreasing density in the bottom insulating layer up to a first metallized surface of the die; and drilling said vias with a decreasing density in the upper insulating layer up to a second metallized surface of the die,
- filling said vias in said upper insulating layer and said lower insulating layer with conductive material to provide a bottom joining layer in electrical contact with said first metallized surface and a bottom conductive path on the outer surface of said bottom insulating layer and an upper joining layer in electrical contact with said second metallized surface and an upper conductive path on the outer surface of said upper insulating layer.

12. The manufacturing method according to claim 8 wherein said drilling and said cutting of said insulating layers to form said vias and said cavities are done with a $CO_2$ laser and wherein said filling said vias and said cavities with conductive material and providing said conductive paths are done through electrodeposition processes.

13. The manufacturing method according to claim 12 comprising removing part of the conductive layer above a position of said via and cavity locations using an UV laser prior to said drilling and cutting said insulating layer.

* * * * *